US005252783A

United States Patent [19]
Baird

[11] Patent Number: 5,252,783
[45] Date of Patent: Oct. 12, 1993

[54] SEMICONDUCTOR PACKAGE

[75] Inventor: John Baird, Scottsdale, Ariz.

[73] Assignee: Motorola, Inc., Schaumburg, Ill.

[21] Appl. No.: 833,223

[22] Filed: Feb. 10, 1992

[51] Int. Cl.⁵ .............................................. H01L 23/28
[52] U.S. Cl. ................................ 174/52.2; 257/667; 257/670; 257/676; 257/787
[58] Field of Search ................ 29/841, 854, 855, 856; 437/211-220; 174/52.2, 52.4; 257/678, 687, 690, 692, 693, 694, 695, 701, 702, 667, 670, 671, 676, 787

[56] References Cited

U.S. PATENT DOCUMENTS

| 4,741,507 | 5/1988 | Baird | 249/91 |
| 4,888,307 | 12/1989 | Spairisano et al. | 437/216 |
| 4,933,744 | 6/1990 | Segaua et al. | 174/52.2 |

FOREIGN PATENT DOCUMENTS

| 0067966 | 6/1977 | Japan . |
| 0087330 | 7/1981 | Japan . |
| 0108335 | 6/1984 | Japan . |
| 0058647 | 4/1985 | Japan . |
| 0092626 | 5/1985 | Japan . |
| 0005529 | 1/1986 | Japan . |

Primary Examiner—Leo P. Picard
Assistant Examiner—Bot Ledynh
Attorney, Agent, or Firm—Joe E. Barbee

[57] ABSTRACT

A semiconductor package is provided having a die attach flag (12) with integral flanges (13) which prevent high pressure plastic encapsulant (18) from escaping or entering between the die attach flag (12) and a mold cavity plate (15) during encapsulation. The die attach flag (12) is held flush against the cavity plate (15) by the packing pressure of the encapsulant (18) during low pressure stages of the encapsulation process. Plastic flowing along the flange (13) solidifies more rapidly than plastic in the body of the semiconductor package, thereby damming plastic flow at the edges of the die attach flag (12) during high pressure stages of the encapsulation process.

12 Claims, 1 Drawing Sheet

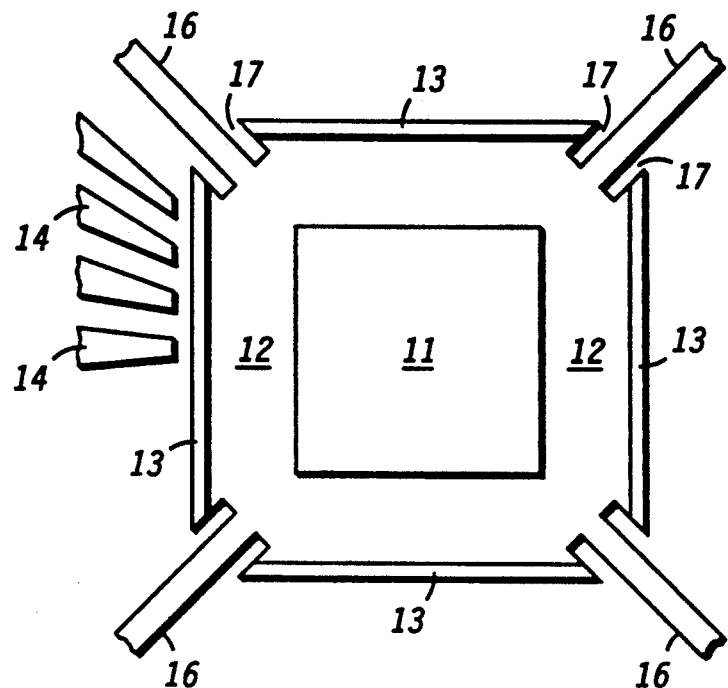
FIG. 1
FIG. 2
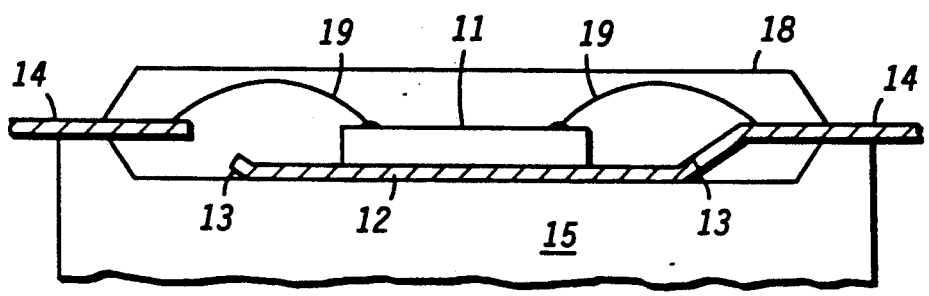

SEMICONDUCTOR PACKAGE

BACKGROUND OF THE INVENTION

The present invention relates, in general, to semiconductor packages, and more particularly, to semiconductor packages for integrated circuits having an exposed die attach flag.

Extensive effort is ongoing in the electronics industry to reduce overall thickness of integrated circuit packages. At the same time, integrated circuit device density is increasing, creating a need for packages which dissipate heat readily. Commodity semiconductor devices have an integrated circuit or "chip" which is mounted on a die attach flag. Wires are attached from the chip to leads. The chip, die attach flag, wires, and portions of the leads are placed in a cavity defined by a cavity plate of a mold press, and are encapsulated in plastic. For integrated circuits, the plastic encapsulation is usually formed on both the top and bottom of the die attach flag.

The presence of plastic underneath the die attach flag significantly inhibits the flow of heat from the die attach flag to an external heatsink or circuit board on which the encapsulated device is mounted. Some semiconductor packages are manufactured with the die attach flag exposed to eliminate the thermal resistance caused by the plastic under the die attach flag. These packages use thick die attach flags, greater than one millimeter thick, so that during the encapsulation process the die flag can be mechanically clamped against the cavity of the mold press. Because the plastic is injected at high pressure during the encapsulation process, prior semiconductor packages required the die flag to be clamped to the cavity to prevent plastic from encroaching under the die flag during encapsulation.

One problem with die attach flags which are mechanically clamped to the cavity plate is that they must be quite thick to effectively prevent plastic from reaching the back surface of the die flag. Alternatively, thinner die flags can be used if they are clamped directly above by pins which firmly clamp the die flag while encapsulant fills the cavity, and retract as the encapsulant hardens. Either of these solutions is unworkable for thin, small semiconductor packages which require leadframes which are quite thin. Also, retracting pins are very complex, expensive, and troublesome in production volume molding applications.

What is needed is a semiconductor package that allows for minimal displacement of the die attach flag during encapsulation without using external clamping, so that a thin semiconductor package can be provided with low thermal resistance.

SUMMARY OF THE INVENTION

Briefly stated, the present invention is achieved by a semiconductor package having a die attach flag with unitary or integral flanges which prevent high pressure plastic encapsulant from escaping between the die attach flag and a mold cavity plate during encapsulation. The die attach flag is held flush against the cavity plate by the packing pressure of the encapsulant during low pressure stages of the encapsulation process. Plastic flowing along the flange solidifies more rapidly than plastic in the body of the semiconductor package, thereby damming plastic flow at the edges of the die attach flag during high pressure stages of the encapsulation process.

BRIEF DESCRIPTION OF THE DRAWINGS

FIG. 1 is a top view of a portion of an unencapsulated semiconductor package in accordance with the present invention; and FIG. 2 is a cross-section view of the semiconductor package shown in FIG. 1.

DETAILED DESCRIPTION OF THE DRAWINGS

FIG. 1 is a highly simplified top view of a portion of an unencapsulated semiconductor package in accordance with the present invention. FIG. 1 illustrates an example of a leadframe adapted to hold a semiconductor chip 11. Chip 11 is mounted in die attach flag 12. Several tie bars 16 extend away from die attach flag 12 and are coupled to a lead frame (not shown). Tie bars 16 serve to support die attach flag 12 during manufacturing. A plurality of leads 14 surround die attach flag 14, although only a few leads 14 are shown to simplify the drawing. Leads 14 are electrically coupled to electrodes on semiconductor chip by well known processes such as wire-bonding, for example.

Preferably, die attach flag 12, tie bars 16, leads 14, and flanges 13 are formed from a single sheet of metal. To provide a thin semiconductor package, the single sheet of metal should be less than 0.2 millimeters thick and in a preferred embodiment is approximately 0.127 millimeters thick. To simplify forming flanges 13 on flag 12, relief notches 17 are provided between flanges 13 and tie bars 16. In a preferred embodiment, tie bars 16 lie in the same plane as flag 12.

Flanges 13 extend upward at an angle from the plane of die attach flag 12, as shown in FIG. 2. Preferably, flanges 13 meet die attach flag 12 at an angle in the range of fifteen to thirty degrees. In a preferred embodiment, flanges 13 are about 0.6 millimeter in length. As can be seen in FIG. 2, die attach flag 12, flanges 13, chip 11, wires 19, and portions of leads 14 are encapsulated by a plastic 18. One lead 14 may be attached to flag 12 to provide electrical contact to flag 12, as shown in the right hand side of FIG. 2. The encapsulation process uses injection molding of a liquid plastic which cures and solidifies in a mold cavity. The mold press (not shown) includes lower cavity plate 15 and an upper cavity plate (not shown) which clamp onto leads 14 during the encapsulation process. The cavity plates define a cavity which in turn defines the shape of plastic encapsulant 18.

Total thickness of the semiconductor package shown in FIG. 2 is less than two millimeters and in the preferred embodiment is approximately one millimeter. Given state of the art restrictions on thickness of chip 11 and loop height of wires 19, one millimeter total thickness is believed to be a minimum thickness which can be practically manufactured.

During the encapsulation process, die attach flag 12 is positioned directly in contact with lower cavity plate 15. Liquid plastic 18 fills the cavity at relatively low pressure. During this low pressure stage, die attach flag 12 is held against lower cavity plate 15 by tie bars 16. During this low pressure stage, it is important to prevent liquid plastic from entering between lower cavity plate 15 and die attach flag 12. This is accomplished in accordance with the present invention by flanges 13. Cavity plate 15 is heated to molding temperature during the encapsulation process. When the mold press is closed, die attach flag 12 and flanges 13 are heated to the molding temperature.

Convergent surfaces are formed by flanges 13 and cavity plate 15. As the fluidized plastic wets these convergent surfaces, the plastic is heated to near molding temperature. A partially cured gel is formed in the convergent surfaces during the initial wetting to prevent flow of plastic underneath flag 12. Convergent surfaces at molding temperature are able to shut-off flow of fluidized epoxy molding compounds, as is described in U.S. Pat. No. 4,741,507 entitled "SELF CLEANING MOLD" issued on May 3, 1988 to the inventor of the present application and assigned to the assignee of the present application. This feature of the present invention allows the cavity to be filled with liquid plastic 18 while allowing die attach flag 12 to remain flush with cavity plate 15.

After the cavity is full the plastic pressure builds. The high packing pressure serves to force die attach flag 12 against cavity plate 15 as plastic 18 solidifies. After plastic 18 solidifies, the outside surface of die attach flag 12 is flush with the cavity surface and plastic 18 extends only to the outside die attach flag surface.

By now it should be appreciated that a semiconductor package which is unusually thin and has an exposed bottom surface of a die attach flag is provided. The exposed die attach flag provides low thermal impedance and efficient thermal coupling between the semiconductor chip and an external heatsink. The thin package reduces overall space required to use the semiconductor device. Moreover, the flanges also serve to grip the encapsulant after the package is formed. By using integral flanges to prevent plastic encapsulant from covering the bottom surface of the die attach flag during molding, the die attach flag and leads can be formed from a thin sheet of metal further reducing overall package size.

I claim:

1. A semiconductor package comprising: a die attach flag, wherein the die attach flag has an upper surface and a lower surface; a plurality of leads which are electrically isolated from the die attach flag; a number of tie bars which are coupled to the die attach flag; upward angled flanges formed at edges of the die attach flag between each of the tie bars; a semiconductor chip mounted on the upper surface of the die attach flag; means for electrically coupling the plurality of leads to selected locations of the semiconductor chip; and a plastic encapsulation covering the semiconductor chip, the means for electrical coupling, the upper surface of the die attach flag, the flange, and portions of the leads, wherein the lower surface of the die attach flag is exposed and forms a lower surface of the semiconductor package.

2. The semiconductor package of claim 1 wherein the flange meets the edge of the die attach flag at approximately a thirty degree angle.

3. The semiconductor package of claim 1 wherein the flange is approximately 0.6 millimeters long.

4. The semiconductor package of claim 1 wherein the die attach flag is less than 0.2 millimeters thick.

5. The semiconductor package of claim 1 wherein the package is approximately one millimeter thick.

6. The semiconductor package of claim 1 wherein the means for electrically coupling comprises wires bonded between the leads and the selected portions of the semiconductor chip.

7. The semiconductor package of claim 1 further comprising relief notches formed between the flange and one of the tie bars.

8. The semiconductor package of claim 1 wherein the tie bars lie in the same plane as the die attach flag.

9. The semiconductor package of claim 1 wherein the die attach flag, the flanges, the leads, and the tie bars are formed from a single sheet of metal.

10. A semiconductor package comprising: a die attach flag having a first surface and a second surface, wherein the second surface is exposed; a semiconductor chip attached to the first surface of the die attach flag; upwardly angled flanges formed at all outer edges of the die attach flag; and a molded plastic encapsulation in which the semiconductor chip, the flanges, and the first surface of the die attach flag are embedded.

11. The semiconductor package of claim 10 wherein the semiconductor package has a bottom surface comprising an annular portion formed by the plastic encapsulation and a central portion formed by the second surface of the die attach flag.

12. The semiconductor package of claim 11 wherein the flanges meet the bottom surface of the semiconductor package at an angle in the range of fifteen to thirty degrees.

* * * * *